(12) United States Patent
Min

(10) Patent No.: US 8,507,942 B2
(45) Date of Patent: Aug. 13, 2013

(54) LIGHT EMITTING DEVICE, LIGHT EMITTING DEVICE PACKAGE AND LIGHTING SYSTEM

(75) Inventor: Hwang Sung Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 269 days.

(21) Appl. No.: 13/096,383

(22) Filed: Apr. 28, 2011

(65) Prior Publication Data

US 2011/0266519 A1 Nov. 3, 2011

(30) Foreign Application Priority Data

Apr. 28, 2010 (KR) .................. 10-2010-0039597

(51) Int. Cl.
*H01L 33/38* (2010.01)
(52) U.S. Cl.
USPC .................................. 257/99; 257/E33.065
(58) Field of Classification Search
None
See application file for complete search history.

(56) References Cited

U.S. PATENT DOCUMENTS

| 7,704,764 B2 * | 4/2010 | Li et al. ........................ 438/29 |
| 7,906,791 B2 | 3/2011 | Nakahara ...................... 257/98 |
| 8,164,108 B2 * | 4/2012 | Lai ................................. 257/98 |

FOREIGN PATENT DOCUMENTS

| JP | 2006-252866 A | 9/2006 |
| JP | 2007-019488 A | 1/2007 |
| KR | 10-2004-0108275 A | 12/2004 |
| KR | 10-2006-0074387 A | 7/2006 |
| KR | 10-2008-0041817 A | 5/2008 |
| KR | 10-2008-0083829 A | 9/2008 |

OTHER PUBLICATIONS

Korean Office Action dated Feb. 7, 2011 issued in Application No. 10-2010-0039597.

* cited by examiner

*Primary Examiner* — Evan Pert
(74) *Attorney, Agent, or Firm* — KED & Associates LLP

(57) ABSTRACT

Provided are a light emitting device, a method of manufacturing the light emitting device, a light emitting device package, and a lighting system. The light emitting device includes a substrate, a light emitting structure including a first conductive type semiconductor layer, an active layer, and a second conductive type semiconductor layer on the substrate, the light emitting structure exposing a portion of the first conductive type semiconductor layer upward, a light transmissive electrode having a stepped portion on the second conductive type semiconductor layer, a second electrode on the light transmissive electrode, and a first electrode on the exposed first conductive type semiconductor layer.

19 Claims, 7 Drawing Sheets

$Q_0 = Q_1 + Q_2$

LIGHT EMITTING DEVICE, LIGHT EMITTING DEVICE PACKAGE AND LIGHTING SYSTEM

CROSS-REFERENCE TO RELATED APPLICATIONS

This application claims under 35 U.S.C. §119 to Korean Patent Application No. 10-2010-0039597 Filed Apr. 28, 2010, which is hereby incorporated by reference.

BACKGROUND

Embodiments relate to a light emitting device, a light emitting device package and a lighting system.

A light emitting device (LED) includes a p-n junction diode which converts electric energy into light energy. The p-n junction diode is manufactured by combining Group III elements of the periodic table with group V elements of the periodic table. The LED can create various colors by adjusting a composition of a compound semiconductor.

According to a related art, there are limitations that a lifetime is shortened and reliability is degraded due to current crowding.

In addition, according to the related art, a current may inversely flow to damage an active layer that is a light emitting region when electrostatic discharge (ESD) occurs. For solving this limitation, a zener diode may be mounted to a package however, light absorption may occur in this case.

SUMMARY

Embodiments provide a light emitting device which can improve current spreading efficiency and light extraction efficiency, a method of manufacturing the light emitting device, a light emitting device package and a lighting system.

Embodiments also provide a light emitting device which can prevent damage due to electrostatic discharge (EDS) without a loss of light absorption, a method of manufacturing the light emitting device, a light emitting device package and a lighting system.

In one embodiment, a light emitting device includes: a substrate; a light emitting structure comprising a first conductive type semiconductor layer, an active layer, and a second conductive type semiconductor layer on the substrate, the light emitting structure exposing a portion of the first conductive type semiconductor layer upward; a light transmissive electrode having a stepped portion on the second conductive type semiconductor layer; a second electrode on the light transmissive and a first electrode the exposed first conductive type semiconductor layer.

In another embodiment, a light emitting device package includes: a package body; a light emitting device on the package body; and an electrode electrically connecting the package body to the light emitting device.

In further another embodiment, a light emitting module includes the light emitting device package.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package and a lighting system according to embodiments will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

Figure 1:
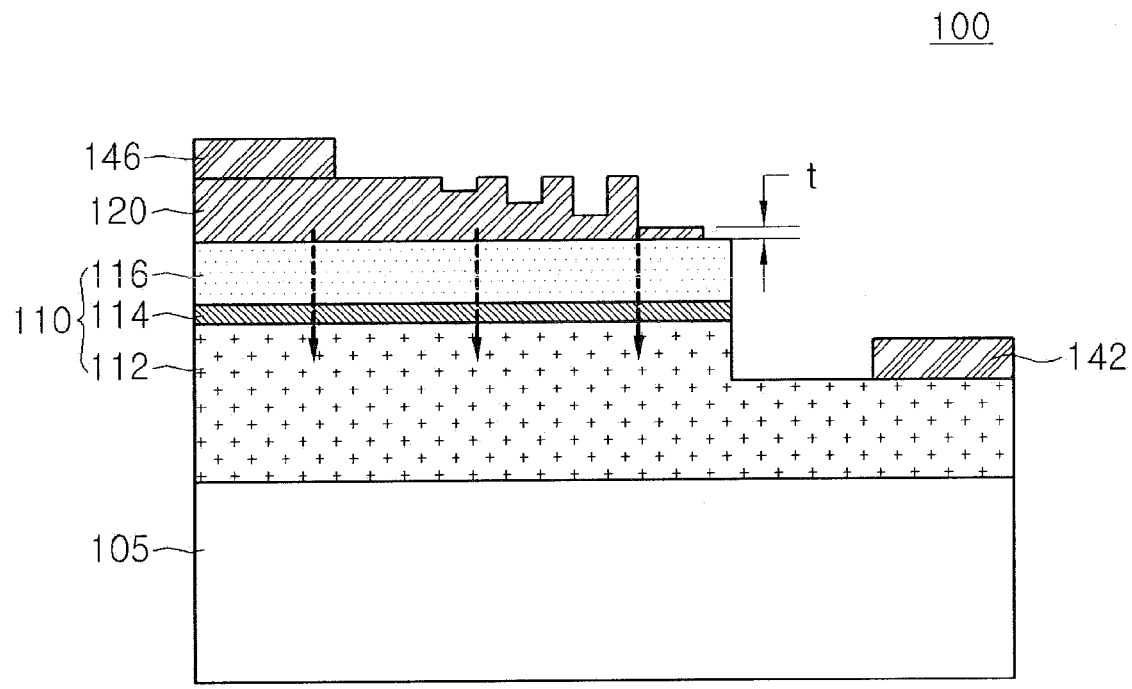
FIG. 1 is a sectional view of a light emitting device according to a first embodiment.

FIG. 1 is a sectional view of a light emitting device according to a first embodiment.

A light emitting device 100 according to an embodiment may include a substrate 105, a first conductive type semiconductor layer 112 on the substrate 105, an active layer 114, and a second conductive type semiconductor layer 116. The light emitting device 100 may further include a light emitting structure 110 upwardly exposing a portion of the first conductive type semiconductor layer 112, a light transmissive electrode 120 having a stepped portion on the second conductive type semiconductor layer 116, a second electrode 146 on the light transmissive electrode 120, and a first electrode 142 on the exposed first conductive type semiconductor layer 112.

According to the embodiment, the light transmissive electrode 120 may have a gradually decreasing thickness t in a mesa etching region. Also, according to the embodiment, the light transmissive electrode 120 may have a thickness gradually decreasing toward the mesa etching region. Also, the light transmissive electrode 120 has the stepped portion between the second electrode 146 and the first electrode 142 and a thickness gradually decreasing from the second electrode 146 to the first electrode 142.

For example, the light emitting device 100 according to the embodiment has a structure in which a current spreading property is improved to enhance light emitting efficiency.

Also, the light transmissive electrode 120 may have thicknesses t different from each other.

For example, in a region of the light transmissive electrode 120 having a thin thickness, a resistance may be increased to decrease an intensity of a current. On the other hand, in a region of the light transmissive electrode 120 having a thick thickness, an intensity of a current may be increased. Thus, the thickness of the light transmissive electrode 120 may be reduced in a mesa edge region to increase the resistance. As a result, an intensity of a concentrately flowing current may be decreased so that a uniform current flows into the whole chip region.

In the light emitting device 100 according to the embodiment, the current flow may be efficiently adjusted to increase light extraction efficiency.

Also, according to the embodiment, reliability of the light emitting device may be improved through the current spreading property.

Hereinafter, a method of manufacturing the light emitting device according to the embodiment will be described with reference to FIGS. 2 to 4. The light emitting device according to the embodiment may be formed of a group III-V semiconductor material such as GaN, GaAs, GaAsP, or GaP, but is not limited thereto. Also, the present disclosure is not limited to a particular process order described below. For example, the process order may be changed.

Figure 2:
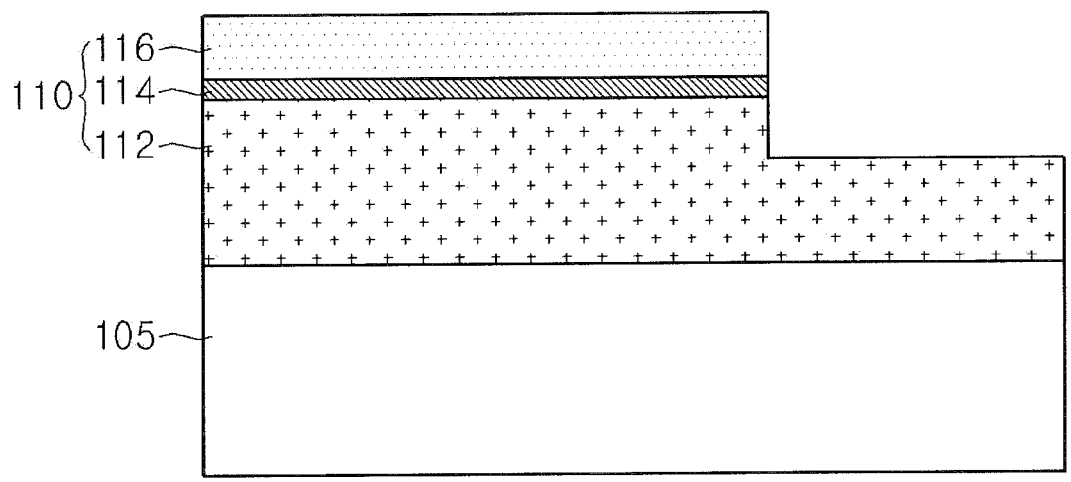
FIGS. 2 to 4 are sectional views illustrating a process of manufacturing the light emitting device according to the first embodiment.

Referring to FIG. 2, a substrate 105 is prepared. The substrate 105 may include a conductive or insulating substrate. For example, at least one of at least one of sapphire ($Al_2O_3$), SiC, Si, GaAs, GaN, ZnO, Si, GaP, InP, Ge, and $Ga_2O_3$ may be used as the first substrate 105. An uneven structure may be formed on the first substrate 105, but is not limited thereto.

A wet cleaning process may be performed on the substrate 105 to remove impurities on a surface of the substrate 105.

Thereafter, a light emitting structure 110 including a first conductive type semiconductor layer 112, an active layer 114, and a second conductive type semiconductor layer 116 is formed on the substrate 105.

According to the embodiment, an undoped semiconductor layer (not shown) may be formed on the substrate 105. The first conductive type semiconductor layer 112 may be formed on the undoped semiconductor layer. For example, an undoped GaN layer may be formed on the substrate 105. Then, an n-type GaN layer may be formed on the undoped GaN layer to form the first conductive type semiconductor layer 112.

Also, a buffer layer (not shown) may be formed on the substrate 105. The buffer layer may reduce lattice mismatching between a material of the light emitting structure 110 and the substrate 115. The buffer layer may be formed of a group III-V compound semiconductor, e.g., at least one of GaN, InN, AlN, InGaN, AlGaN, InAlGaN, and AlInN. The undoped semiconductor layer may be formed on the buffer layer, but is not limited thereto.

The first conductive type semiconductor layer 112 may be realized by a group III-V compound semiconductor doped with a first conductive dopant. In a case where the first conductive type semiconductor layer 112 is an N-type semiconductor layer, the first conductive dopant may include Si, Ge, Sn, Se, and Te as the N-type dopant, but is not limited thereto.

The first conductive type semiconductor layer 112 may be formed of a semiconductor material having a composition formula of $In_xAl_yGa_{1-x-y}N$ ($0 \leq x \leq 1$, $0 \leq y \leq 1$, $0 \leq x+y \leq 1$), but is not limited thereto.

The first conductive type semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

In the first conductive type semiconductor layer 112, an N-type GaN layer may be formed using a method of a chemical vapor deposition (CVD), a molecular beam epitaxy (MBE), a sputtering, or a hydride vapor phase epitaxy (HVPE). Also, the first conductive type semiconductor layer 112 may be formed by injecting a trimethyl gallium gas (TMGa), an ammonium gas ($NH_3$), a nitrogen gas ($N_2$), and a silane gas ($SiH_4$) including an n-type impurity such as silicon (Si) into a chamber.

The active layer 114 is a layer which emits light having energy determined by an intrinsic energy band of an active layer (light emitting layer) material when electrons injected from the first conductive type semiconductor layer 112 meet holes injected to from the second conductive semiconductor layer 116.

The active layer 114 may have at least one of a single quantum well structure, a multi quantum well (MQW) structure, a quantum wire structure, and a quantum dot structure. For example, the active layer 114 may have the MQW structure by injecting the trimethyl gallium gas (TMGa), the ammonia gas ($NH_2$), the nitrogen gas ($N_2$), and the trimethyl indium gas (TMIn), but is not limited thereto.

The well layer/barrier layer of the active layer 114 may have at least one pair structure of InGaN/GaN, InGaN/InGaN, GaN/AlGaN, InAlGaN/GaN, GaAs(InGaAss)/AlGaAs, and GaP(InGaP)/AlGaP, but is not limited thereto. The well layer may be formed of a material having a band gap less than that of the barrier layer.

A conductive clad layer may be formed on or/and under the active layer 114. The conductive clad layer may be formed of an AlGaN-based semiconductor and have a band gap greater than that of the active layer 114.

The second conductive type semiconductor layer 116 may be formed of a group III-V compound semiconductor doped with a second conductive dopant, e.g., a semi conductor material having a composition formula of $In_xAl_yGa_{1-x-y}N$ ($0 \leq x \leq 1$, $0 \leq y \leq 1$, $0 \leq x+y \leq 1$). For example, the second conductive type semiconductor layer 116 may be formed of one of GaN, AlN, AlGaN, InGaN, InN, InAlGaN, AlInN, AlGaAs, GaP, GaAs, GaAsP, and AlGaInP. In a case where the second conductive type semiconductor layer 116 is a P-type semiconductor layer, the second conductive dopant may include Mg, Zn, Ca, Sr, and Ba as the P-type dopant. The second conductive type semiconductor layer 116 may be formed in a single layer or multi layer, but is not limited thereto.

In the second conductive type semiconductor layer 116, a P-type GaN layer may be formed by injecting biscetyl cyclopentadienyl magnesium ($EtCp_2Mg$){$Mg(C_2H_5C_5H_4)_2$} including P-type impurities such as the trimethyl gallium gas (TMGa), the ammonia gas ($NH_3$), the nitrogen gas ($N_2$), and magnesium (Mg) into the chamber, but it is not limited thereto.

In the embodiment, the first conductive type semiconductor layer 112 and the second conductive type semiconductor layer 116 may be respectively realized as the N-type semiconductor layer and the P-type semiconductor layer, but are not limited thereto. Furthermore, a semiconductor having a polarity opposite to that of the second conductive type, e.g., an N-type semiconductor layer (not shown) may be formed on the second conductive type, semiconductor layer 116. Thus, the light emitting structure 110 may have one of an N-P junction structure, a P-N junction structure, an N-P-N junction structure, and a P-N-P junction structure.

A mesa etching process may be performed on the light emitting structure 110 to upwardly expose a portion of the first conductive type semiconductor layer 112. For example, an etching process may be performed from the second conductive type semiconductor layer 116 using a predetermined etching pattern (not shown) as a mask in a region in which the first electrode 142 is formed, and then the active layer 114 may be successively etched to expose a portion of a top surface of the first conductive type semiconductor layer 112.

Figure 3:
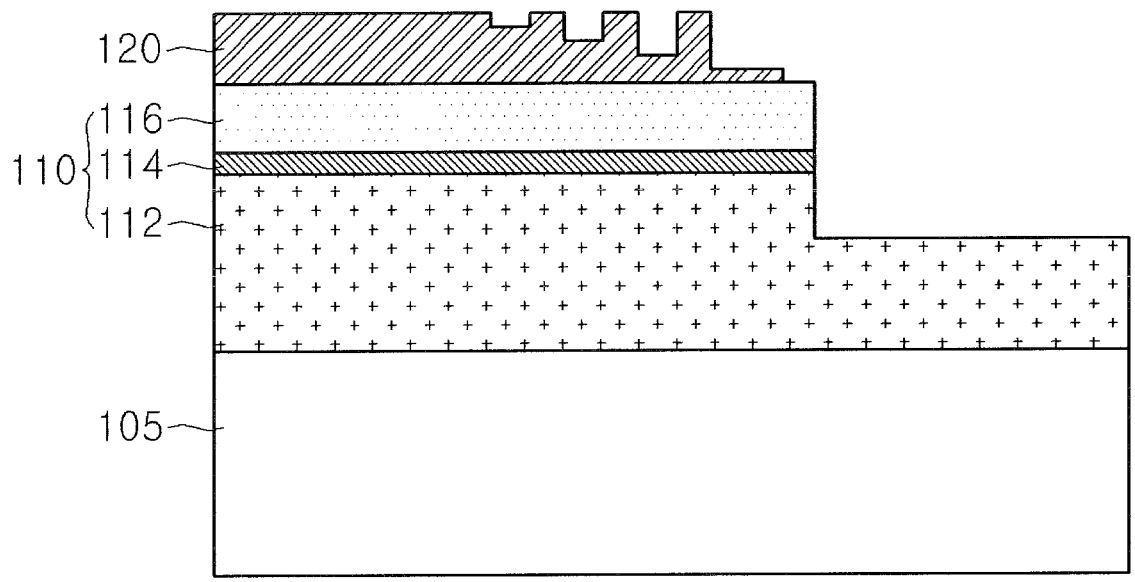

Referring to FIG. 3, a light transmissive electrode 120 may be formed on the light emitting structure 110. For example, the light transmissive electrode 120 may be formed by multiply stacking a single metal, a metal alloy, or a metal oxide. For example, the light transmissive electrode 120 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO(AGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

A plurality of etching processes may be performed so that the resultant light transmissive electrode 120 has thicknesses different from each other to form the light transmissive electrode 120 having the stopped portion, but is not limited thereto.

Figure 4:
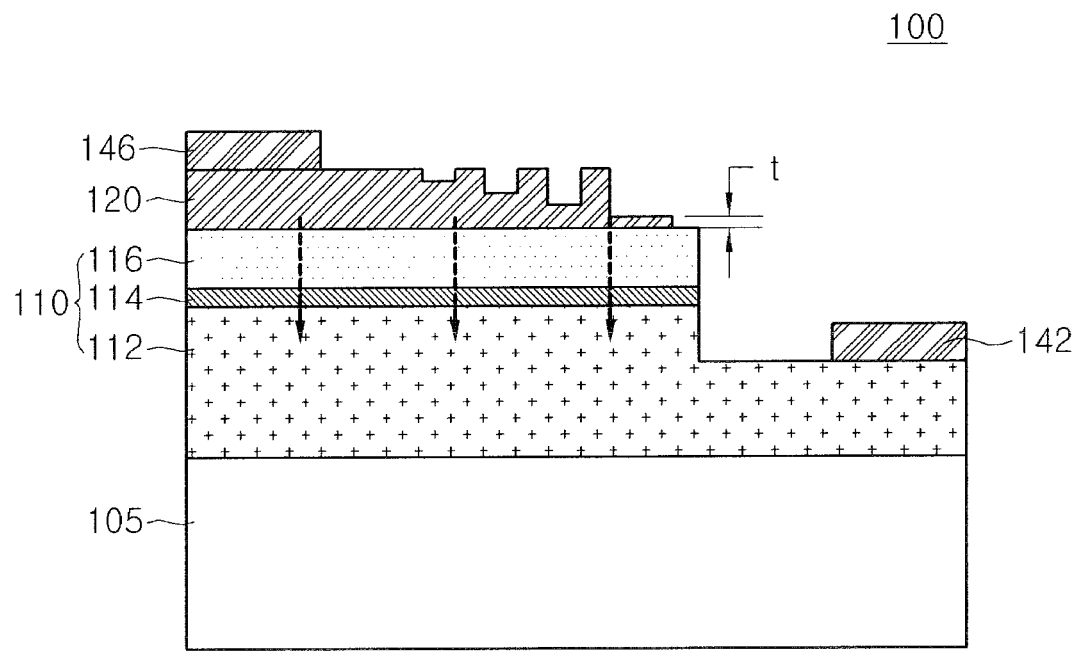

Referring to FIG. 4, a first electrode 142 may be formed on the exposed first conductive type semiconductor layer 112, and a second electrode 146 may be formed on the light transmissive electrode 120.

The first electrode 142 and the second electrode 146 may be formed of at least one of Ti, Cr, Ni, Al, Pt, Au, and N, but is not limited thereto.

According to the embodiment, the light transmissive electrode 120 may have a gradually decreasing thickness t in a mesa etching region. For example, in a region of the light transmissive electrode 120 having a thin thickness, a resistance may be increased to decrease an intensity of a current. On the other hand, in a region of the light transmissive electrode 120 having a thick thickness, an intensity of a current may be increased. Thus, the thickness of the light transmissive electrode 120 may be reduced in a mesa edge region to increase the resistance. As a result, an intensity of a concentrately flowing current may be decreased so that a uniform current flows into the whole chip region.

In the light emitting device 100 according to the embodiment, the current flow may be efficiently adjusted to increase light extraction efficiency.

Also, according to the embodiment, reliability of the light emitting device may be improved through the current spreading property.

Figure 5:
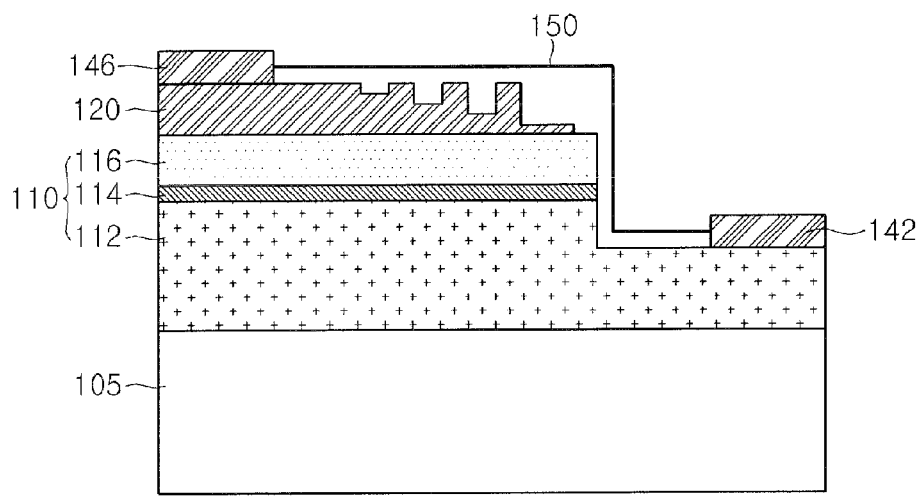
FIG. 5 is a sectional view of a light emitting device according to a second embodiment.

FIG. 5 is a sectional view of a light emitting device according to a second embodiment.

The second embodiment may adopt technical features of the first embodiment.

According to the second embodiment, a dielectric layer 150 may be further disposed on a light transmissive electrode 120 having a stepped portion. A first electrode 142 may contact a side of the dielectric layer 150.

Also, the dielectric layer 150 may be disposed on an exposed first conductive type semiconductor layer 112 and the light transmissive electrode 120.

The dielectric layer 150 may be a light transmissive dielectric, and thus disposed on a light emitting region. For example, the dielectric layer 150 may be formed of $TiO_2$, $Al_2O_3$, or $SiO_2$, but is not limited thereto.

In the embodiment, the dielectric layer 150 may be disposed in a mesa edge region to prevent a current from being concentrated into the mesa edge region and electrostatic discharge (EDS) from occurring.

Thereafter, the first electrode 142 may be disposed on the exposed first conductive type semiconductor layer 112 contacting the dielectric layer 150. Also, a second electrode 146 may be disposed on the light transmissive electrode 120.

According to the second embodiment, the first electrode 142, the dielectric layer 150, and the second electrode 146 may function as a metal/insulator/semiconductor (MIS) capacitor.

According to the embodiment, for preventing a light emitting diode (LED) from being damaged due to the ESD, the dielectric layer 150 may be disposed between the first electrode 142 and the second electrode 146 to realize a structure in which the first electrode 142 and the second electrode 146 are electrically opened.

Thus, although a current flows into an active region under a constant voltage to generate light, energy having a high frequency component may pass through the dielectric layer when an ESD shock of a pulse form is generated due to the ESD to protect an active layer.

According to the second embodiment, the dielectric layer 150 may be disposed in a mesa edge region to prevent a current from being concentrated into the mesa edge region and electrostatic discharge (EDS) from occurring.

The first electrode 142 may be disposed on the exposed first conductive type semiconductor layer 112, wherein the first electrode 142 may contact the dielectric layer 150 and extends up to a top surface of the dielectric layer 150.

Thus, a contact area between the first electrode 142 and the dielectric layer 150 may be increased to increase capacity. In addition, the dielectric layer 150 may firmly contact a light emitting structure by the first electrode 142.

Also, the dielectric layer 150 may contact the second electrode 146. Also, the second electrode 146 may contact the dielectric layer 150 and also be disposed on a top surface of the dielectric layer 150 to increase the capacity and firmly contact the dielectric layer 150.

Also, the dielectric layer 150 may contact the second electrode 146, wherein the dielectric layer 150 may be disposed on a top surface of the second electrode 146 to increase the capacity.

According to the embodiment, since the dielectric layer 150 is disposed on the light emitting region, the dielectric layer 150 may be a light transmissive dielectric layer, but is not limited thereto.

According to the embodiment, the dielectric layer 150 may contacts the light transmissive electrode 120. However, the dielectric layer 150 may not contact the second electrode 146. In this case, since the dielectric layer 150 covers a small area of a second conductive type semiconductor layer 116 that is a light extraction region, the EDS prevention effect and the light extraction efficiency may be improved.

According to the embodiment, for preventing the LED from being damaged due to the ESD, the dielectric layer 150 may be disposed between the first electrode 142 and the second electrode. Thus, although a current flows into the active region under a constant voltage to generate light, energy having a high frequency component may pass through the dielectric layer when an ESD shock of a pulse form is generated due to the ESD to protect the active layer.

Figure 6:
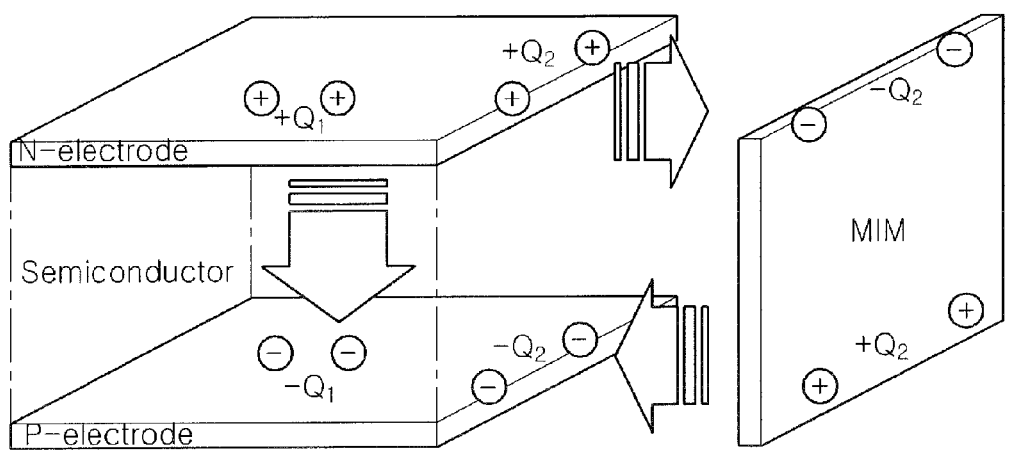
FIG. 6 is a concept diagram illustrating an electric field generated when electrostatic discharge occurs in the light emitting device according to the second embodiment.

FIG. 6 is a concept diagram illustrating an electric field generated when electrostatic discharge occurs in the light emitting device according to the second embodiment.

The LED breakdown due to the ESD may occur when a reverse voltage is applied to the semiconductor. When the reverse voltage is applied, a strong electric field may be induced within the LED active region by a charged electrical charge.

When the ESD occurs, carriers (electrons and holes) are accelerated to collide with atoms, thereby generate other carriers. Also, the generated carriers may generate a large amount of carriers. This phenomenon may refer to as avalanche breakdown. If a strong electric field is induced by the charged electrical charge to apply unbearable static electricity to the semiconductor, the LED semiconductor breakdown may occur due to the avalanche breakdown.

Thus, as shown in FIG. 6, a capacitor structure having an MIS form may be inserted so that the electric field loaded to the inside of the LED active layer is partially induced to the MIS capacitor to reduce the electric field of the active region, thereby improving a tolerance to the ESD.

That is, according to a related art, the whole strong electric field $Q_0$ due to a charged electric charge may be induced into an LED active region so that the LED breakdown occurs by the avalanche breakdown. On the other hand, according to the embodiment, a portion $Q_2$ of the electric field $Q_0$ due to the charged electric charge may be induced into the region of the dielectric layer 150 to reduce intensity $Q_1$ of the electric field in the LED active region.

Figure 7:
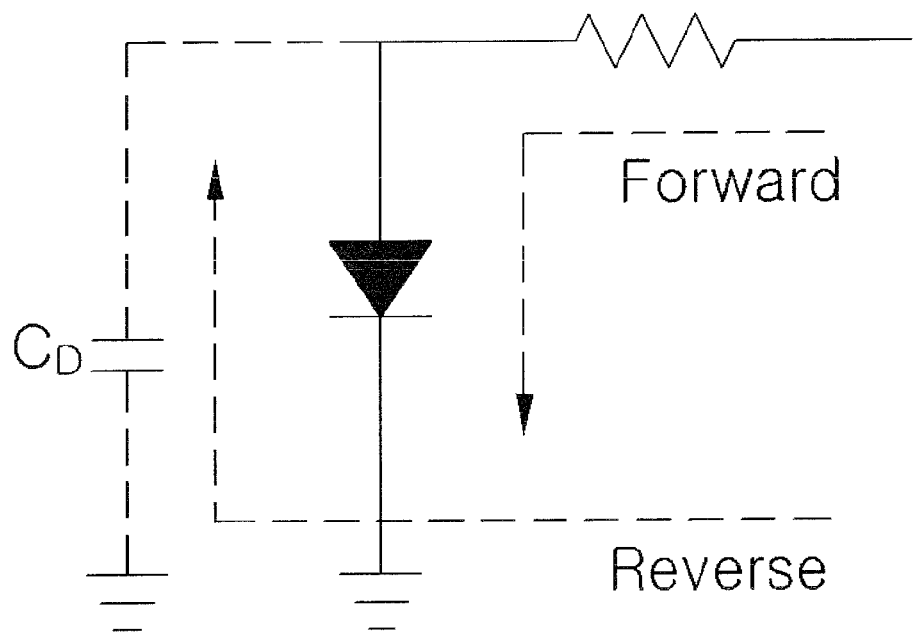
FIG. 7 is an exemplary circuit diagram of the light emitting device according to the second embodiment.

FIG. 7 is an exemplary circuit diagram of the light emitting device according to the second embodiment.

In the embodiment, each of the first dielectric layer 142, the dielectric layer 150, and the second electrode 146 may function as a capacitor $C_D$.

As shown in FIG. 7, a circuit for the light emitting device according to the embodiment may be realized. In a case where a voltage is forwardly applied due to a constant voltage, a current flows through the LED to generate light. Also, in a case where a voltage is reversely applied due to the ESD, a current flows through the MIS capacitor $C_D$.

Here, in a case where a voltage is reversely applied due to the ESD, the more a total capacitance $C_{Tot}$ becomes larger, the more the current flow to the active layer due to an ESD stress becomes less to reduce the shock.

This relation is expressed as following equations.

$Q_{Dis} = C_{ESD} V_{ESD}$

Where, $Q_{Dis}$ denotes a charge amount during the discharging, $C_{ESD}$ denotes a capacitance during the discharging.

$C_{Tot}' = C_{Diode} + C_D$ (with MIS capacitor)

$C_{Tot} = C_{Diode}$ (without MIS capacitor)

$I = dQ/dt = \Delta Q/\tau = Q_{Dis}/(RC_{Tot}) \therefore C_{Tot} \uparrow \rightarrow I \downarrow$ $\therefore I' = Q_{Dis}/(RC') < I = Q_{Dis}/(RC_{Tot})$ That is, in the case where the voltage is reversely applied due to the ESD, the more the total capacitance $C_{Tot}$ becomes larger, the more the current (I') flown to the active layer due to the ESD stress becomes smaller to reduce the shock.

Figure 8:
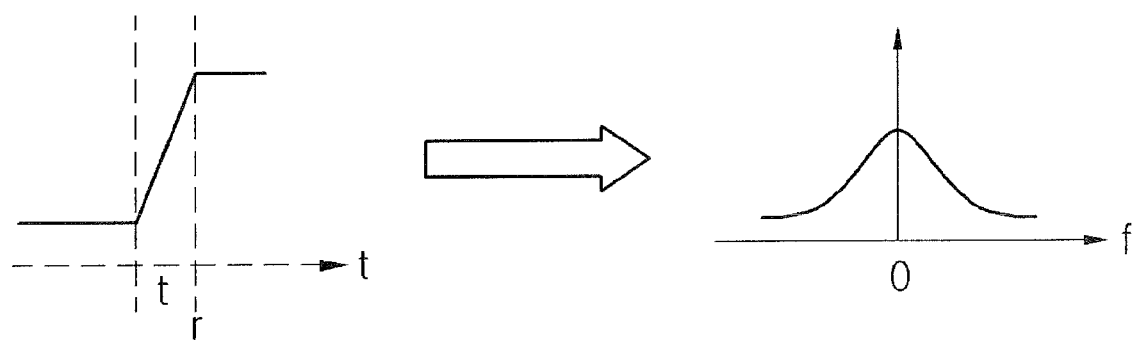
FIG. 8 is a view illustrating a waveform when the electrostatic discharge occurs in the light emitting device according to the second embodiment.

FIG. 8 is a view illustrating a waveform when the electrostatic discharge occurs in the light emitting device according to the second embodiment.

As shown in FIG. 8, a pulse wave has a high frequency component through a Fourier conversion. The more a rising time ($t_r$) becomes steeper, the more the high frequency component becomes larger.

As expressed in following equations, as a frequency becomes higher, impedance (resistance) due to capacitance becomes smaller. Accordingly, in the case where the voltage is reversely applied due to the ESD, since the impedance of the MIS capacitor becomes smaller, the high frequency current may flow into the MIS capacitor.

Impedance: $Z = Z_R + jZ_{Im}$ (Zr denotes real impedance, j denotes an imaginary number factor, and $Z_{Im}$ denotes an impedance due to the capacitor)

Capacitor: $Z_{Im,C} = 1/(j\omega C)$ ($\omega = 2\pi f$)

That is, in the case where the voltage is reversely applied due to the ESD, since the impedance of the MIS capacitor becomes smaller, the high frequency current may flow into the MIS capacitor.

A method of manufacturing the light emitting device, a light emitting device package, and a lighting system according to the embodiment, the LED damage duo to the ESD may be prevented without a loss of light absorption.

Also, according to the embodiment, since the capacitor is disposed within an LED chip to prevent the LED from being damaged due to the ESD, packaging costs and processes may be simplified, and also, the reduction of light absorption may be minimized.

Also, in the light emitting device 100 according to the embodiment, the current flow may be efficiently adjusted to increase light extraction efficiency.

Also, according to the embodiment, reliability of the light emitting device may be improved through the current spreading property.

Figure 9:
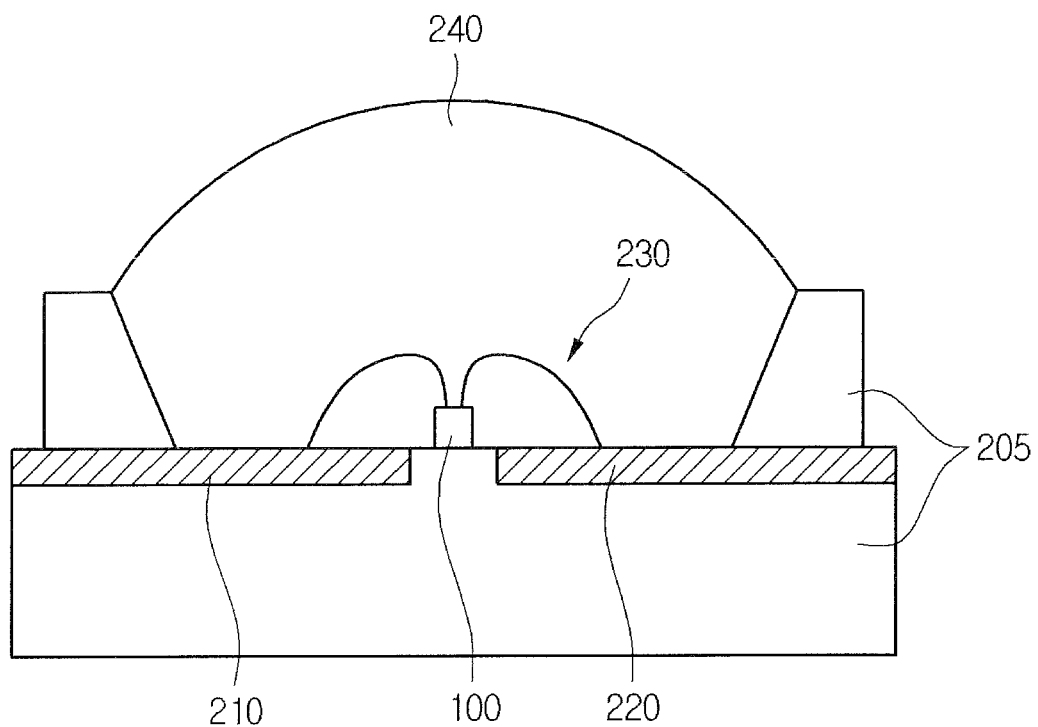
FIG. 9 is a sectional view of a light emitting device package according to an embodiment.

FIG. 9 is a sectional view of a light emitting device package according to an embodiment.

Referring to FIG. 9, a light emitting device package according to an embodiment includes a body part 205, a fourth electrode layer 210 and fifth electrode layer 220 disposed on the body part 205, a light emitting device 100 disposed on the body part 205 and electrically connected to the fourth electrode layer 210 and the fifth electrode layer 220, and a molding member 240 surrounding the light emitting device 100.

The body part 205 may be formed of a silicon material, a synthetic resins material, or a metal material. Also, an inclined surface may be disposed around the light emitting device 100.

The fourth electrode layer 210 and the fifth electrode layer 220 are electrically separated from each other and provide a power to the light emitting device 100. Also, the fourth electrode layer 210 and the fifth electrode layer 220 may reflect light generated in the light emitting device 100 to increase light efficiency. In addition, the fourth electrode layer 210 and the fifth electrode layer 220 may emit heat generated in the light emitting device 100 to the outside.

A vertical type light emitting device illustrated in FIGS. 1 to 5 may be adopted for the light emitting device 100, but is not limited thereto. The light emitting device 100 may be disposed on the body part 205.

The light emitting device 100 may be electrically connected to the fourth electrode layer 210 and/or the fifth electrode layer 220 through a wire 230. In the embodiment, since the vertical type light emitting device is described as an example, two wires 230 may be provided. Alternatively, when a flip chip type light emitting device is used as the light emitting device 100, the wire 230 may not be provided.

The molding member 40 may surround the light emitting device 100 to protect the light emitting device 100. Also, the molding member 240 may contain a phosphor to vary a wavelength of light emitted from the light emitting device 100.

The light emitting device package according to an embodiment may be applied to a lighting system. The lighting system may include a lighting unit illustrated in FIG. 10 and a backlight unit illustrated in FIG. 11. For example, the lighting system may include traffic lights, vehicle headlights, and signs.

Figure 10:
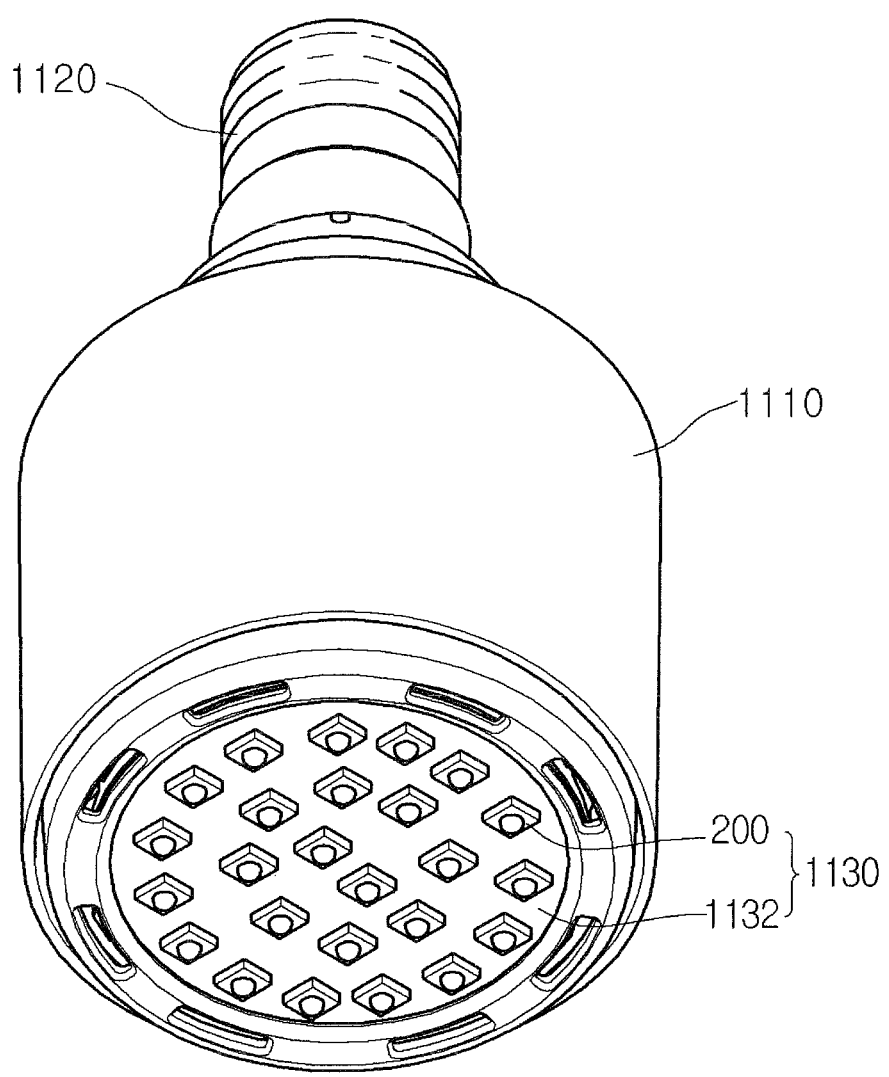
FIG. 10 is a perspective view of a lighting unit according to an embodiment.

FIG. 10 is a perspective view of a lighting unit 1100 according to an embodiment.

Referring to FIG. 10, the lighting unit 1100 may include a case body 1110, a light emitting module 1130 disposed on the case body 1110, and a connection terminal 1120 disposed on the case body 1110 to receive a power from an external power source.

The case body 1110 may be formed of a material having an excellent heat radiation characteristic. For example, the case body 1110 may be formed of a metal material or resin material.

The light emitting module 1130 may include a board 1132 and at least one light emitting device package 200 mounted on the board 1132.

The board 1132 may be an insulator on which circuit patterns are printed. For example, the board 1132 may include a general printed circuit board (general PCB), a metal core PCB, a flexible PCB, and a ceramic PCB.

The board 1132 may also be formed of a material which efficiently reflects light, or its surface may be coated with color, e.g., a white or silver color, which efficiently reflects light.

At least one light emitting device package 200 may be mounted on the board 1132. Each of light emitting device packages 200 may include at least one light emitting diode (LED) 100. The LED 100 may include a colored light emitting diode which emits light having various colors such as red, green, blue, or white color or a UV light emitting diode which emits ultraviolet rays (UV).

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRT).

The connection terminal 1120 may be electrically connected to the light emitting module 1130 to supply a power. As shown in FIG. 10, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

Figure 11:
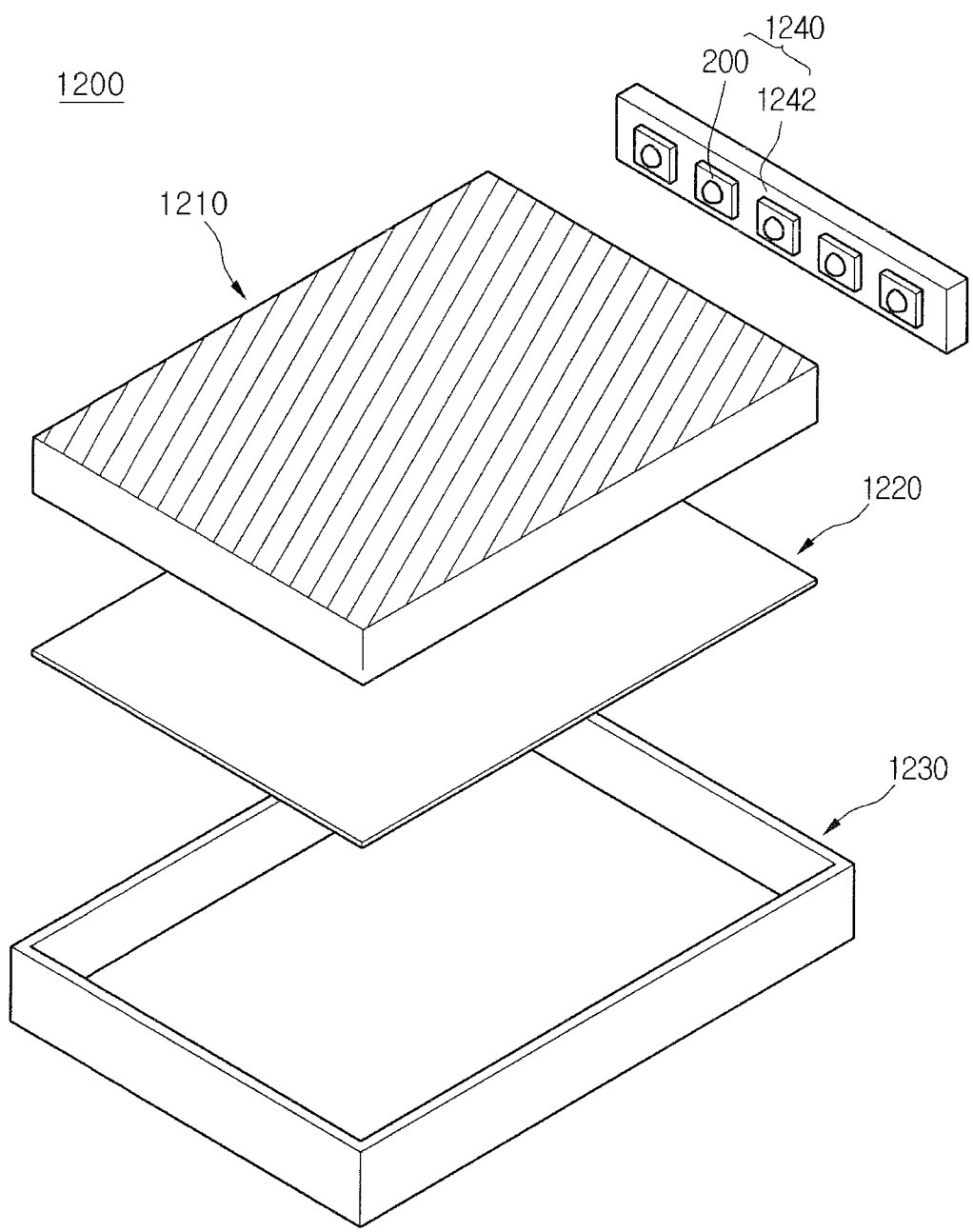
FIG. 11 is an exploded perspective view of a backlight unit according to an embodiment.

FIG. 11 is an exploded perspective view of a backlight unit 1200 according to an embodiment.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a light transmissive material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. Particularly, the light emitting module 1240 may include a board 1242 and a plurality of light emitting device packages 200 mounted on the board 1242. The board 1242 may contact the light guide plate 1210, but is not limited thereto.

The board 1242 may be a PCB including a circuit pattern (not shown). However, the board 1242 may include a metal core PCB or a flexible PCB as well as the PCB, but is not limited thereto.

The light emitting device packages 200 may have light emitting surfaces that emit light on the board 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a substrate;
a light emitting structure comprising a first conductive type semiconductor layer, an active layer, and a second conductive type semiconductor layer on the substrate, the light emitting structure exposing a portion of the first conductive type semiconductor layer upward;

a light transmissive electrode having a stepped portion on the second conductive type semiconductor layer;

a second electrode on the light transmissive electrode; and a first electrode on the exposed first conductive type semiconductor layer, wherein the light transmissive electrode has a thickness gradually decreasing toward a mesa etching region.

2. The light emitting device according to claim 1, wherein the light transmissive electrode has a gradually decreasing thickness on the mesa etching region.

3. The light emitting device according to claim 1, wherein the light transmissive electrode has the stepped portion between the second electrode and the first electrode, and the light transmissive electrode has a thickness gradually decreasing from the second electrode toward the first electrode.

4. The light emitting device according to claim 1, wherein a dielectric layer is further disposed on the stepped light transmissive electrode, and the first electrode contacts one side of the dielectric layer.

5. The light emitting device according to claim 4, wherein the second electrode contacts the other side of the dielectric layer.

6. The light emitting device according to claim 4, wherein the first electrode is disposed also on a top surface of the dielectric layer.

7. The light emitting device according to claim 4, wherein the dielectric layer is a light transmissive dielectric layer.

8. The light emitting device according to claim 4, wherein the dielectric layer is disposed in a mesa edge region.

9. A light emitting device comprising:

a substrate;

a light emitting structure comprising a first conductive type semiconductor layer, an active layer, and a second conductive type semiconductor layer on the substrate, the light emitting structure exposing a portion of the first conductive type semiconductor layer upward;

a light transmissive electrode having a stepped portion on the second conductive type semiconductor layer;

a second electrode on the light transmissive electrode; and a first electrode on the exposed first conductive type semiconductor layer, wherein the light transmissive electrode has a stepped portion between the second electrode and the first electrode, and the light transmissive electrode has a thickness gradually decreasing from the second electrode toward the first electrode.

10. The light emitting device according to claim 9, wherein the light transmissive electrode has a gradually decreasing thickness on the mesa etching region.

11. The light emitting device according to claim 9, wherein the light transmissive electrode has a thinner thickness on the mesa etching region.

12. The light emitting device according to claim 9, wherein a dielectric layer is further disposed on the stepped light transmissive electrode, and the first electrode contacts one side of the dielectric layer.

13. The light emitting device according to claim 12, the second electrode contacts the other side of the dielectric layer.

14. The light emitting device according to claim 12, wherein the first electrode is disposed also on a top surface of the dielectric layer.

15. The light emitting device according to claim 12, wherein the dielectric layer is a light transmissive dielectric layer.

16. The light emitting device according to claim 12, wherein the dielectric layer is disposed in a mesa edge region.

17. The light emitting device according to claim 9, wherein the light transmissive electrode is formed of at least one of ITO, IZO(In—ZnO), GZO(Ga—ZnO), AZO(Al—ZnO), AGZO(Al—GaZnO), IGZO(In—GaZnO), IrOx, RuOx, RuOx/ITO, Ni/IrOx/Au, Ni/IrOx/Au/ITO, Ni, Pt, Cr, Ti, and Ag.

18. The light emitting device according to claim 12, wherein the first electrode, the dielectric layer, and the second electrode function as a capacitor.

19. A light emitting device package comprising:

a package body;

a light emitting device on the package body, the light emitting device according to claim 1; and an electrode electrically connecting the package body to the light emitting device.

* * * * *